(12) United States Patent
Takahashi

(10) Patent No.: US 6,358,360 B2
(45) Date of Patent: *Mar. 19, 2002

(54) PRECISION POLISHING APPARATUS FOR POLISHING A SEMICONDUCTOR SUBSTRATE

(75) Inventor: Kazuo Takahashi, Kawasaki (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/451,444

(22) Filed: Nov. 30, 1999

(30) Foreign Application Priority Data

Nov. 30, 1998 (JP) ............................. 10-355384
Nov. 26, 1999 (JP) ............................. 11-335258

(51) Int. Cl.[7] ................................. C23F 1/02
(52) U.S. Cl. ............... 156/345; 438/690; 438/691; 438/692; 438/693; 438/753; 438/754
(58) Field of Search ............... 438/692, 693, 438/745, 753, 754; 156/345

(56) References Cited

U.S. PATENT DOCUMENTS

| | | | | |
|---|---|---|---|---|
| 5,575,885 A | * | 11/1996 | Hirabayashi et al. | 156/626.1 |
| 5,791,973 A | * | 8/1998 | Nishio | 451/41 |
| 5,921,853 A | * | 7/1999 | Nishio | 451/289 |
| 6,046,110 A | * | 4/2000 | Hirabayashi et al. | 438/693 |
| 6,074,289 A | * | 6/2000 | Murakami et al. | 451/388 |
| 6,083,419 A | * | 7/2000 | Grumbine et al. | 252/79.1 |
| 6,183,345 B1 | * | 2/2001 | Kamono et al. | 541/8 |
| 6,191,038 B1 | * | 2/2001 | Yoshida et al. | 438/691 |

FOREIGN PATENT DOCUMENTS

| | | | |
|---|---|---|---|
| JP | 11-135466 | * | 5/1999 |
| JP | 11-195628 | * | 7/1999 |

* cited by examiner

Primary Examiner—Benjamin L. Utech
Assistant Examiner—Charlotte A. Brown
(74) Attorney, Agent, or Firm—Fitzpatrick, Cella, Harper & Scinto

(57) ABSTRACT

A precision polishing method and a precision polishing apparatus are adapted to be used with a chemical etching technique of utilizing a chemical effect for polishing a metal film without producing any process-altered layer nor any scratches on the metal surface and without the risk of partly burying the polishing agent near the metal surface in order to flatten and smooth or remove the metal film. With a precision polishing method and a precision polishing apparatus according to the invention, the surface to be polished of a substrate 1 carrying thereon a metal film for forming a semiconductor device is pressed against a hard polishing pad 4, while an etching solution 7 is supplyed to the surface to be polished and that of the polishing pad 4 that are held in contact with each other and the surface to be polished and the polishing pad 4 are driven to move relative to each other. Then, the etching solution on the surface to be polished gives rise to a local temperature rise in projecting areas of the metal film found in the surface to be polished due to the generated frictional heat and the etching rate of the etching solution is raised in those areas to selectively etch the projecting areas of the metal film and flatten the surface. Thereafter, the metal film is uniformly etched and removed.

12 Claims, 7 Drawing Sheets

PRECISION POLISHING APPARATUS FOR POLISHING A SEMICONDUCTOR SUBSTRATE

BACKGROUND OF THE INVENTION

1. Field of the Invention

This invention relates to a precision polishing method and a precision polishing apparatus for polishing a semiconductor substrate. More particularly, the present invention relates to a precision polishing method and a precision polishing apparatus for flattening or removing the wiring material film formed on an insulating film of a semiconductor element in the process of manufacturing a semiconductor integrated circuit.

2. Related Background Art

The trend in recent years of producing semiconductor integrated circuits that are increasingly down-sized and multilayered is accompanied by the need for improved flattening technologies. A major advancement is brought forth in the filed of flattening technologies by chemical mechanical polishing (CMP).

FIG. 7 of the accompanying the drawing schematically illustrates a known chemical mechanical polishing (CMP) apparatus. As shown, it comprises a substrate-holding part 202 for removably holding a substrate 201 that may be a wafer with the surface to be polished facing downward and a polishing table 205 placed vis-a-vis the substrate 201 held by the substrate-holding part 202 and carrying a large caliber polishing pad 204 having a diameter greater than that of the substrate 201 as the latter is bonded thereto. The apparatus further comprises a first drive means 211 for driving the substrate-holding part 202 to revolve, a pressuring means 212 for applying pressure to the substrate 201 so as to make the surface, to be polished, of the substrate 201 pressed against polishing pad 204 and a second drive means 213 for driving the polishing table 205 to revolve, a polishing agent supply means 215 being additionally provided in order to supply the polishing pad 204 with a polishing agent 207.

With a polishing apparatus having a configuration as described above, the substrate 201 and the polishing pad 204 are driven to revolve respectively by the first drive means 211 and the second drive means 213 in the directions as indicated by the arrows in FIG. 7 so as to make the surface, to be polished, of the substrate 201 held by the substrate-holding part 202 abut the upper surface of the polishing pad 204 on the polishing table 205 and the pressurizing means 212 apply pressure to the substrate 201 to a predetermined pressure level to polish the surface while the polishing agent supply means 215 is operated to drop the polishing agent 207 onto the polishing pad 204. The polishing agent 207 is normally referred to as slurry that is a suspension prepared by mixing fine particles of silicon oxide, cerium oxide or alumina into an aqueous solution of potassium hydroxide or ammonium. Thus, the surface to be polished is flattened and smoothed by the combination of the chemical effect of the polishing agent and the physical effect of the polishing particles.

As described above, a polishing agent normally referred to as slurry that is a suspension prepared by mixing fine particles of silicon oxide, cerium oxide or alumina into an aqueous solution of potassium hydroxide or ammonium is used for CMP. Such a polishing agent is designed to be mainly used for polishing interlayer insulating films of semiconductor devices and hence can give rise to scratches on the metal surface when it is used for ductile metals such as copper (Cu) and aluminum (Al) and metal alloys containing them as principal ingredients as well as other problems including the problem of particles of the polishing agent buried into the metal surface. In the case of burying a tungsten (W) plug, where the plug has a small diameter between 0.5 and 1 $\mu$m while the surface of the insulating film on the surface to be polished is far greater than the exposed surface of the tungsten plug and both tungsten and the material of the insulating film are fragile, the dishing problem can be alleviated to a certain extent by using a polishing pad showing an appropriate degree of compressibility.

However, in the process of forming wires from a metal film, particularly in a dual damascene process mainly using copper, the ratio of the exposed surface area of the insulating film to the surface area of the wiring metal is closer to 1 than the above instance so that conventional CMP techniques encounter the problem of a remarkable dishing phenomenon appearing on the wiring metal along with the problem of producing a process-altered layer near the surface of the object to be polished because the surface to be polished is subjected to pressure of a level between 200 to 500 gr/cm$^2$ for the purpose of polishing.

SUMMARY OF THE INVENTION

In view of the unsolved problems of conventional techniques, it is therefore the object of the present invention to provide a precision polishing method and a precision polishing apparatus applicable to dual damascene processes involving the use of metal, highly ductile copper in particular, and adapted to be used with a chemical etching technique of utilizing a chemical effect for polishing a wiring metal film without producing any process-altered layer nor any scratches on the metal surface and without the risk of partly burying the polishing agent near the metal surface in order to flatten a smooth or remove the metal film.

In an aspect of the invention, the above object is achieved by providing a precision polishing method, comprising supplying an etching solution to the surface to be polished comprising the metal of a semiconductor device and flattening and removing said surface to be polished comprising said metal by utilizing a change of etching rate caused by the change of the temperature of the etching solution.

Preferably, with a precision polishing method according to the invention, a local temperature change is produced on the surface to be polished to cause said change of etching rate by locally applying heat to the semiconductor substrate having said surface to be polished or causing it to locally emit heat in order to produce a selective etching effect due to temperature difference, thereby flattening and removing said surface to be polished comprising said metal. Preferably, with a precision polishing method according to the invention, the temperature of the projecting areas of said metal in said surface to be polished is set higher than the temperature of the area other than said projecting areas of said metal in said surface to be polished and an abutting member is made to abut on said surface to be polished, thereby polishing and flattening said surface to be polished comprising the metal.

With a precision polishing method according to the invention, the projecting areas of the surface to be polished can be selectively caused to emit heat and raise the temperature thereof by making an abutting member abut on the surface to be polished with or without an etching solution interposed therebetween and driving the abutting member to move along and relative to the surface to be polished.

In another aspect of the present invention, there is provided a precision polishing apparatus adapted to polishing the surface to be polished comprising the metal of a semiconductor device by making the surface to be polished comprising the metal of a semiconductor device abut on a hard polishing pad under pressure of a predetermined level while supplying an etching solution to the surface to be polished and the abutment surface of said hard polishing pad and driving said surface to be polising to move relative to said polishing pad, thereby polishing said surface to be polished comprising the metal, said apparatus comprising at least either a means for locally raising the temperature of the projecting areas of said metal in said surface to be polished or a means for cooling the area other than said projecting areas of said metal in said surface to be polished so as to make the temperature of the projecting areas of said metal in said surface to be polished higher than the temperature of the area other than said projecting areas in said surface and utilize the change of etching rate caused by the change of the temperature of said etching solution supplied to said surface to be polished and the abutting surface of said hard polishing pad, thereby flattening and removing said surface to be polished comprising said metal.

Preferably, in a precision polishing apparatus according to the invention, a local temperature change is produced on and near the surface of a semiconductor substrate having said surface to be polished comprising the metal of the semiconductor device to cause said change of etching rate by locally applying heat to said semiconductor substrate or causing it to locally emit heat in order to produce a selective etching effect due to temperature difference, thereby flattening and removing said surface to be polished comprising said metal.

Preferably, in a precision polishing apparatus according to the invention, the projecting areas of the surface to be polished are selectively caused to emit heat and raise the temperature thereof by making the hard polishing pad abut on the surface to be polished with or without an etching solution interposed therebetween and driving the abutting member to move along and relative to the surface to be polished.

Preferably, in a precision polishing apparatus according to the invention further comprises a temperature control means for controlling the temperature of the etching solution. Preferably, a precision polishing apparatus according to the invention further comprises a collecting means for collecting said etching solution, a regulating means for filtering said etching solution and regulating its ingredients and a circulating means for circulating said etching solution.

Preferably, said metal of the semiconductor device is copper, aluminum, tungsten or an alloy containing at least one of the above listed metals. Preferably, said etching solution is a solution containing iron (III) chloride or copper (II) chloride, an alkaline aqueous solution containing a copper amine complex as principal ingredient or an etching solution containing a mixture of hydrogen peroxide and a sulfuric acid type solution. A polishing agent of fine solid particles with a primary particle size between 0.02 and 0.5 m may be added to the etching solution.

A precision polishing method and a precision polishing apparatus according to the invention may be applied to a dual damascene process, particularly to a dual damascene process mainly using copper.

According to the invention, there is also provided a precision polishing method adapted to polish the surface to be polished of a substrate by supplying liquid thereto, said method comprising the steps of supplying a chemical solution having an effect of etching projecting areas of metal on said surface to be polished as said liquid and controlling the temperature of said projecting areas of metal.

Preferably, a precision polishing method according to the invention further comprises a step of polishing said surface to be polishing by causing a hard polishing pad having a modulus of compressive elasticity between $9.8 \times 10^7$ Pa and $9.8 \times 10^{10}$ Pa, or 10 kgf/mm$^2$ and 10,000 kfg/mm$^2$ to abut on said surface to be polished. Preferably, with a precision polishing method according to the invention, said step of controlling the temperature of said projecting areas of metal is conducted by heating said projecting areas of metal by a heating means or by cooling the area of said surface to be polished other than said projecting areas of metal.

According to the invention, there is also provided a precision polishing method adapted to polish the surface to be polished of a substrate by supplying liquid thereto, said method comprising steps of supplying a chemical solution having an effect of etching projecting areas of metal on said surface to be polished as said liquid and polishing said surface to be polishing by causing a hard polishing pad having a modulus of compressive elasticity between $9.8 \times 10^7$ Pa and $9.8 \times 10^{10}$ Pa, or 10 kgf/mm$^2$ and 10,000 kfg/mm$^2$ to abut said surface to be polished.

Preferably, a precision polishing method according to the invention further comprises a step of controlling the temperature of said projecting areas of metal.

According to the invention, there is also provided a precision polishing apparatus having a substrate-holding means for holding a substrate and a polishing pad holding member and adapted to polish the surface to be polished of said substrate by supplying liquid thereto, said apparatus comprising a supply means for supplying a chemical solution having an effect of etching projecting areas of metal on said surface to be polished as said liquid and a temperature control means for controlling the temperature of said projecting areas of metal.

Preferably, in a precision polishing apparatus according to the invention, said temperature control means is a cooling means for cooling the area of said surface to be polished other than said projecting areas of metal or a heating means for heating said projecting areas of metal. Preferably, in a precision polishing apparatus according to the invention, said polishing pad holding member removably holds a hard polishing pad having a modulus of compressive elasticity between $9.8 \times 10^7$ Pa and $9.8 \times 10^{10}$ Pa, or 10 kgf/mm$^2$ and 10,000 kfg/mm$^2$ to abut said surface to be polished.

According to the invention, there is also provided a precision polishing apparatus having a substrate-holding means for holding a substrate and a polishing-pad-holding member and adapted to polish the surface to be polished of said substrate by supplying liquid thereto, said apparatus comprising a supply means for supplying a chemical solution having an effect of etching projecting areas of metal on said surface to be polished as said liquid, said polishing pad holding member removably holding a hard polishing pad having a modulus of compressive elasticity between $9.8 \times 10^7$ Pa and $9.8 \times 10^{10}$ Pa, or 10 kgf/mm$^2$ and 10,000 kfg/mm$^2$ to abut said surface to be polished.

Preferably, a precision polishing apparatus according to the invention further comprises a temperature control means for controlling the temperature of said projecting areas of metal. Preferably, in a precision polishing apparatus according to the invention, said temperature control means is a cooling means for cooling the area of said surface to be polished other than said projecting areas of metal or a heating means for heating said projecting areas of metal.

Thus, with a precision polishing method and a precision polishing apparatus according to the invention, it is now possible to flatten and remove the metal film formed on a substrate by using an etching solution or a chemical solution adapted to principally exert a chemical effect in a polishing operation and show a selective etching rate that varies as a function of the temperature of the etching solution or the chemical solution.

Additionally, as a result of polishing the wiring metal film formed on an insulating film that is already flattened in a dual damascene process by utilizing the selective etching rate of an etching solution or a chemical solution that varies as a function of the temperature of the etching solution or the chemical solution, there is no risk of producing a dishing phenomenon on the metal surface. Still additionally, since no polishing agent that contains abrasive grains is used, there arises no risk of producing scratches on the metal surface nor that of partly burying the abrasive grains of the polishing agent near the metal surface. Furthermore, since the operating pressure applied to the substrate can be reduced unlike conventional CMP techniques, no process-altered layer would appear on and near the metal surface as a result of the polishing operation.

Finally, according to the invention, a substrate is polished by means of a precision polishing apparatus comprising one or more than on spiral type fluid flow paths as temperature control means arranged at least in the polishing head or the substrate-holding means. As fluid is made to flow through the flow paths, the entire surface to be polished of the substrate can be made to show a uniform temperature distribution. Then, the projecting areas of metal on the surface to be polished is heated as they are scraped by the polishing pad while the surface to be polished is held to show a uniform temperature distribution. As a result, the projecting areas show a high etching rate so that the metal film is accurately flattened.

Thus, with such a method and an apparatus, it is now possible to reliably form wires to be buried into wiring grooves or grooves for contact holes that are arranged in the insulating film on a semiconductor substrate.

DETAILED DESCRIPTION OF THE PREFERRED EMBODIMENTS

Now, the present invention will be described by referring to the accompanying drawings that illustrate preferred embodiments of the invention.

Figure 1:
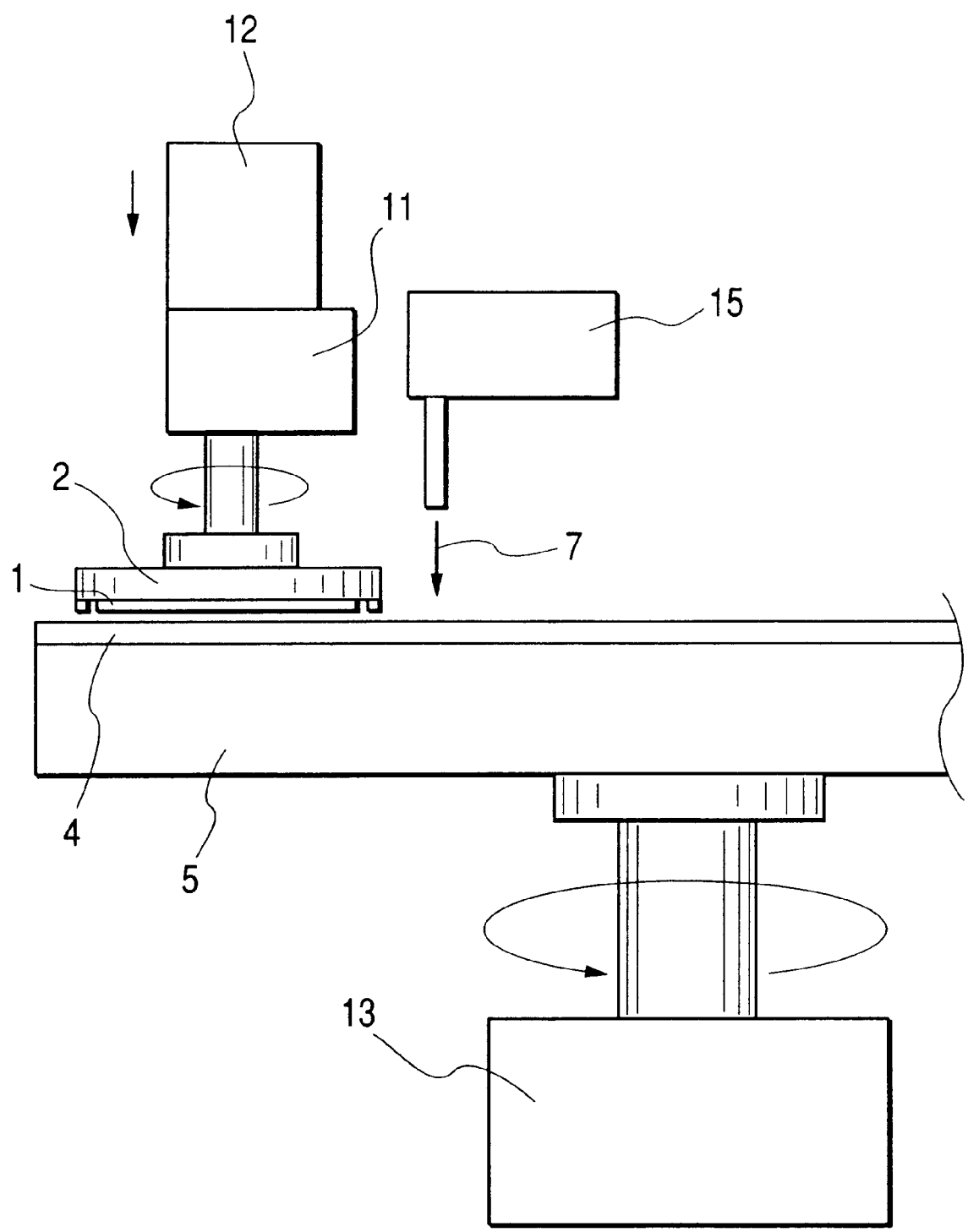
FIG. 1 is a schematic illustration of a first embodiment of a precision polishing apparatus according to the invention, showing its configuration.
Figure 2:
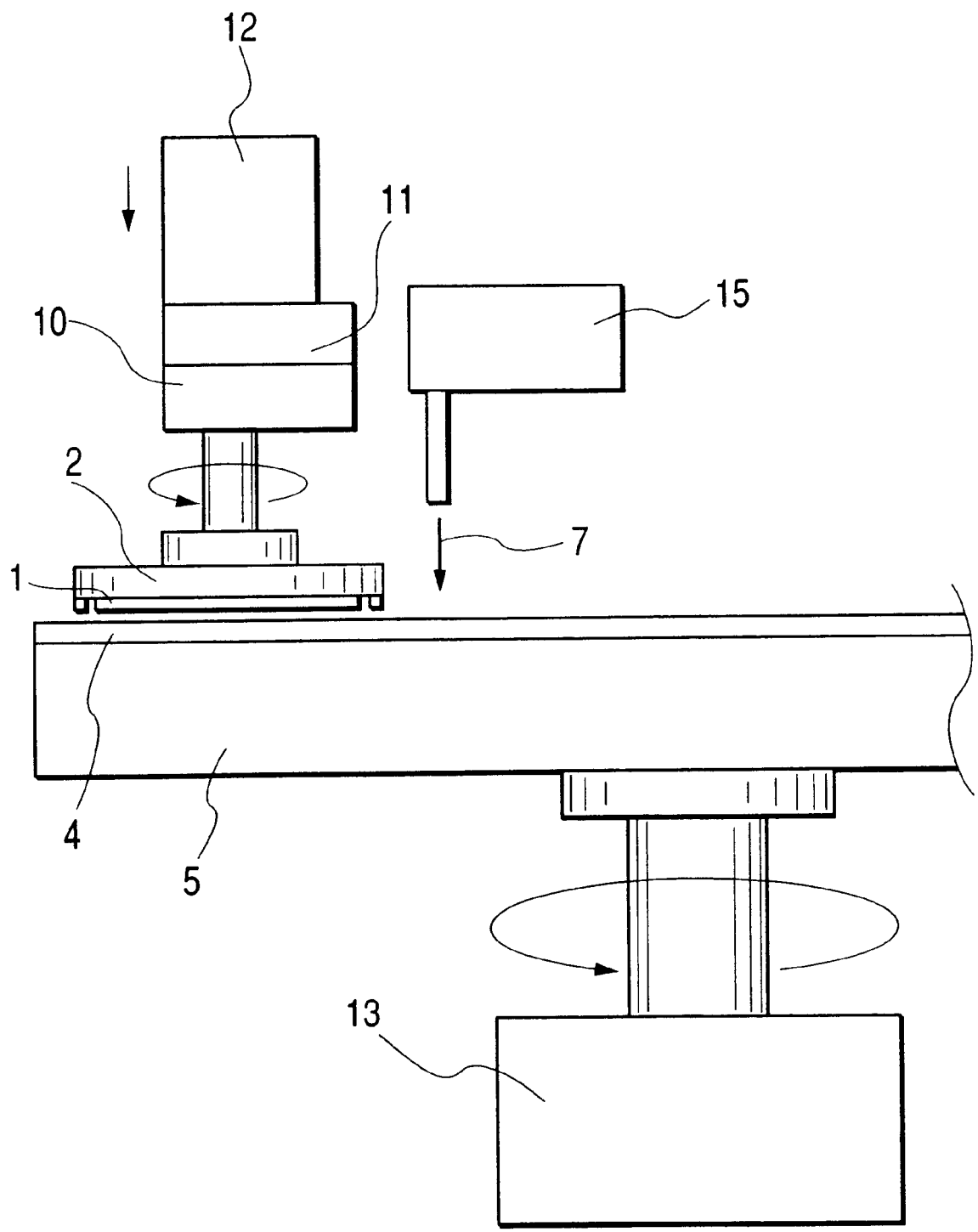
FIG. 2 is a schematic illustration of a second embodiment of a precision polishing apparatus according to the invention, showing its configuration.
Figure 3:
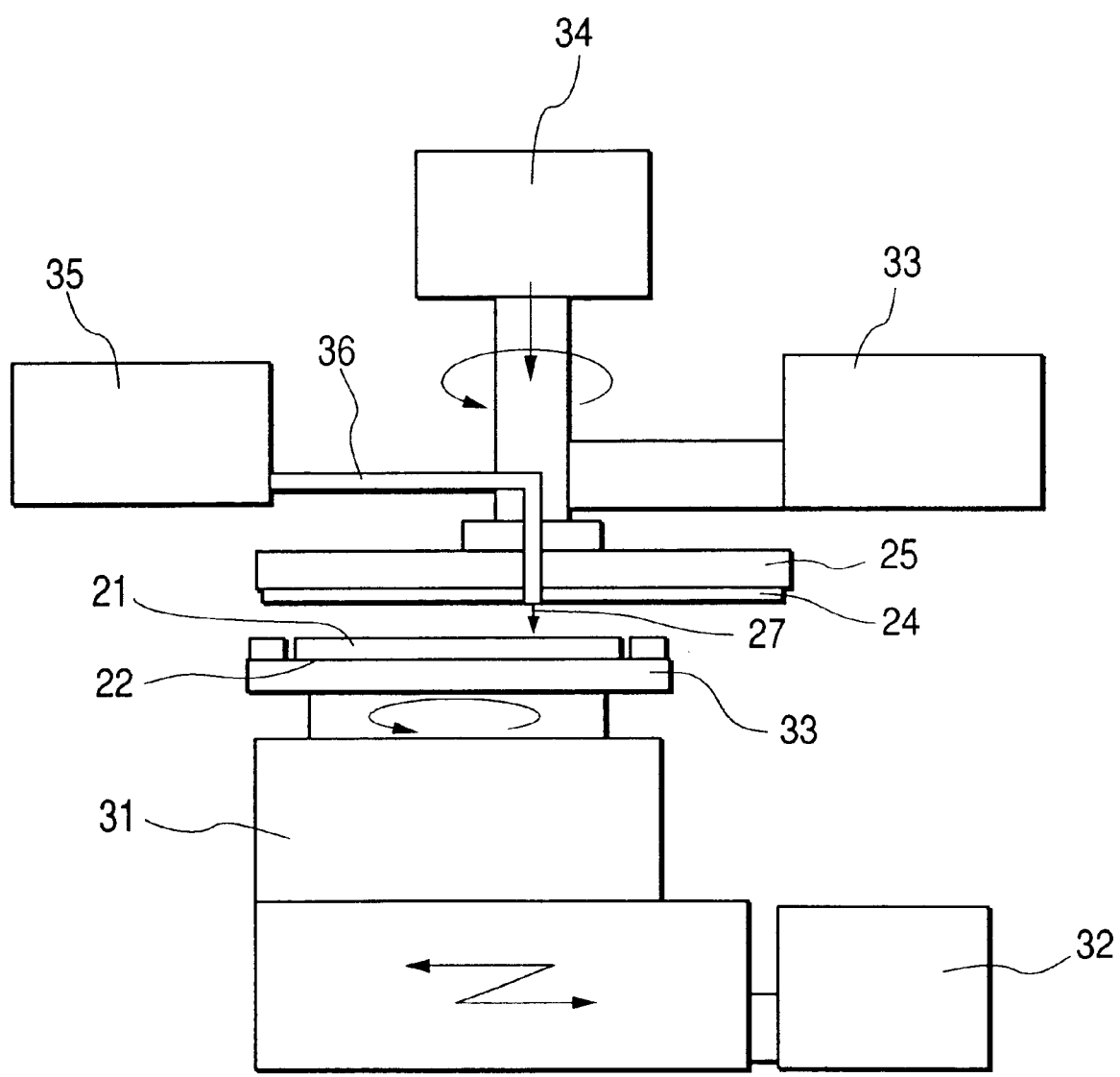
FIG. 3 is a schematic illustration of a third embodiment of a precision polishing apparatus according to the invention, showing its configuration.

FIGS. 1 and 2 are schematic illustrations of first and second embodiments of precision polishing apparatus according to the invention, showing their respective configurations, and FIG. 3 is a schematic illustration of a third embodiment of precision polishing apparatus according to the invention, showing its configuration.

First Embodiment

The first embodiment of precision polishing apparatus according to the invention will be described by referring to FIG. 1.

As shown in FIG. 1, the first embodiment of precision polishing apparatus comprises a substrate-holding part 2 for removably holding a substrate 1 that may be a wafer with the surface to be polished facing downward, a polishing table 5 (i.e. a polishing head 5) placed vis-a-vis the substrate 1 held by the substrate holding part 2 and carrying a large caliber hard polishing pad 4 having a diameter greater than that of the substrate 1 (and a modulus of compressive elasticity between $9.8 \times 10^7$ Pa and $9.8 \times 10^{10}$ Pa, or 10 kgf/mm$^2$ and 10,000 kgf/mm$^2$, such as that of polytetrafluoroethylene) as the latter is bonded thereto, a first drive means 11 for driving the substrate holding part 2 to revolve, a pressurizing means 12 for applying pressure to the substrate 1 so as to make the surface to be polished of the substrate 1 pressed against polishing pad 4, and a second drive means 13 for driving the polishing table 5 to revolve, said first drive means 11 and said second drive means 13 being arranged to drive the substrate 1 and the hard polishing pad 4 to revolve substantially at a same rate. Additionally, there is provided a polishing agent supply means 15 for supplying the polishing pad 4 with a polishing agent (chemical solution) 7. The etching solution (chemical solution) 7 is such that mainly its chemical effect (etching effect) on a metal film may be exploited. For example, if used for copper, said etching solution is a solution containing iron (III) chloride or copper (II) chloride, an alkaline aqueous solution containing a copper amine complex as principal ingredient or an etching solution containing a mixture of hydrogen peroxide and a sulfuric acid based solution. If the surface to be polished is that of a wiring copper film, preferably a solution obtained by mixing iron (III) chloride with pure water, regulating the specific gravity of the mixture to about 1.38 and adding 1 to 5% hydrochloric acid thereto is used. Alternatively, a solution otained by mixing copper (II) chloride with pure water, regulating the specific gravity of the mixture to 1.25to 1.28 and adding hydrochloric acid to make the mixture show an appropriate mixing ratio is also preferably used.

A mode of precision polishing mainly utilizing the chemical effect (etching effect) of an etching solution will be discussed below.

With conventional chemical mechanical polishing (CMP), a polishing agent normally referred to as slurry that is a suspension prepared by mixing particles of silicon oxide, cerium oxide or alumina into an aqueous solution of potassium hydroxide or aqueous ammona is used. Such a polishing agent is designed to mainly mechanically polish the surface to be polished and hence it is far from directly exerting a chemical effect on the surface. To the contrary, according to the invention, an etching solution is used and its chemical etching effect is exploited to polish the metal film of the wiring layer formed on a substrate so as to smooth or remove the metal film.

While a variety of etching solutions may be used for the purpose of the invention, the etching process with such an etching solution proceeds uniformly over the entire surface to be polished without selectivity so that it cannot selectively polish projecting areas of the metal film to flatten the entire surface. However, such etching solutions show a high etching rate when the temperature rises. In other words, with such etching solutions, the etching rate is highly dependent on the temperature of the solution. Therefore, the etching solution can be provided with a degree of selectivity when it is locally heated to locally raise its temperature.

Now, referring back to the embodiment of precision polishing apparatus shown in FIG. 1, the substrate 1 to be polished is fitted to the substrate holding part 2 with the surface to be polished facing downward and pressed against the hard polishing pad 4 placed on the polishing table 5 under pressure of a predetermined degree by the pressurizing means 12. At the same time, the substrate 1 and the hard polishing pad 4 are driven to revolve respectively by the first drive means 11 and the second drive means 13 in the directions as indicated by arrows in FIG. 1. At this time, the first drive means 11 and the second drive means 13 are so arranged as to drive the substrate 1 and the hard polishing pad 4 to revolve substantially at a same rate. Then, the etching solution 7 is dropped onto the hard polishing pad 4 from the polishing agent supply means 15. As the surface to be polished of the substrate 1 is pressed against the hard polishing pad 4 and they are driven to move relative to each other, heat is generated by friction between the hard polishing pad 4 and the surface to be polished of the substrate 1, particularly in the projecting areas of the surface of the substrate 1. The amount of the generated frictional heat is proportional to the frictional force obtained by multiplying the applied pressure by the coefficient of friction, the amount of the relative movement and the duration of the relative movement. Therefore, the temperature of the projecting areas of the surface to be polished that are as high as about 1 $\mu$m and held in tight contact with the hard polishing pad 4 can be controlled by selecting appropriate values for the above parameters. As the projecting areas of the surface to be polished of the substrate 1 are instantaneously heated by the frictional heat generated by the friction, the etching rate of the etching solution is raised in those projecting areas so that the etching effect is promoted in those areas. As a result, the projecting areas are selectively etched and polished and the surface to be polished is consequently polished and flattened mainly by the chemical effect (etching effect) of the etching solution to realize precision polishing according to the invention.

The present invention can be applied to a process of forming metal wires on a semiconductor device, a dual damascene process in particular. This will be discussed below.

Figure 6A:
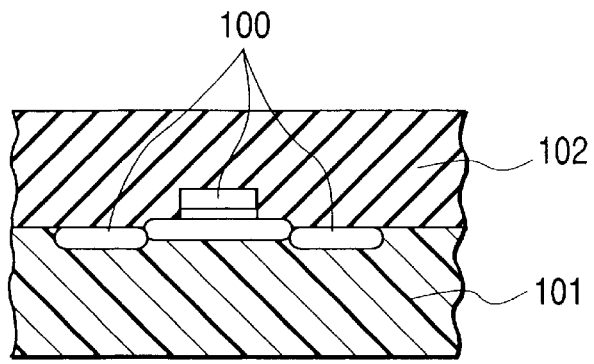
FIGS. 6A, 6B, 6C and 6D are schematic process diagrams showing different wire forming steps in a dual damascene process.
Figure 6B:
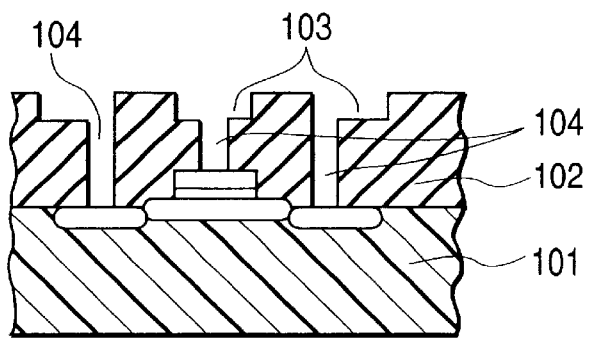
Figure 6C:
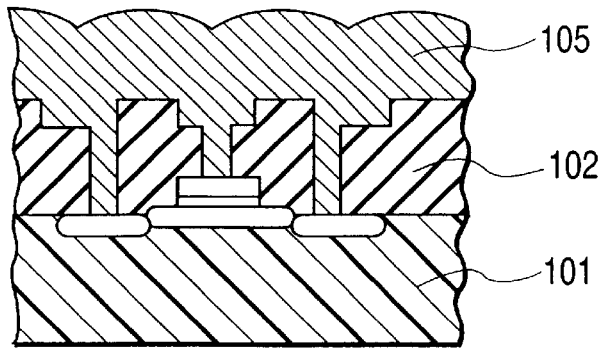
Figure 6D:
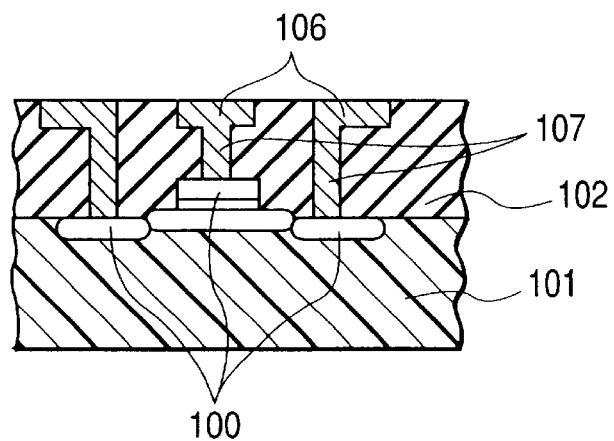
Figure 7:
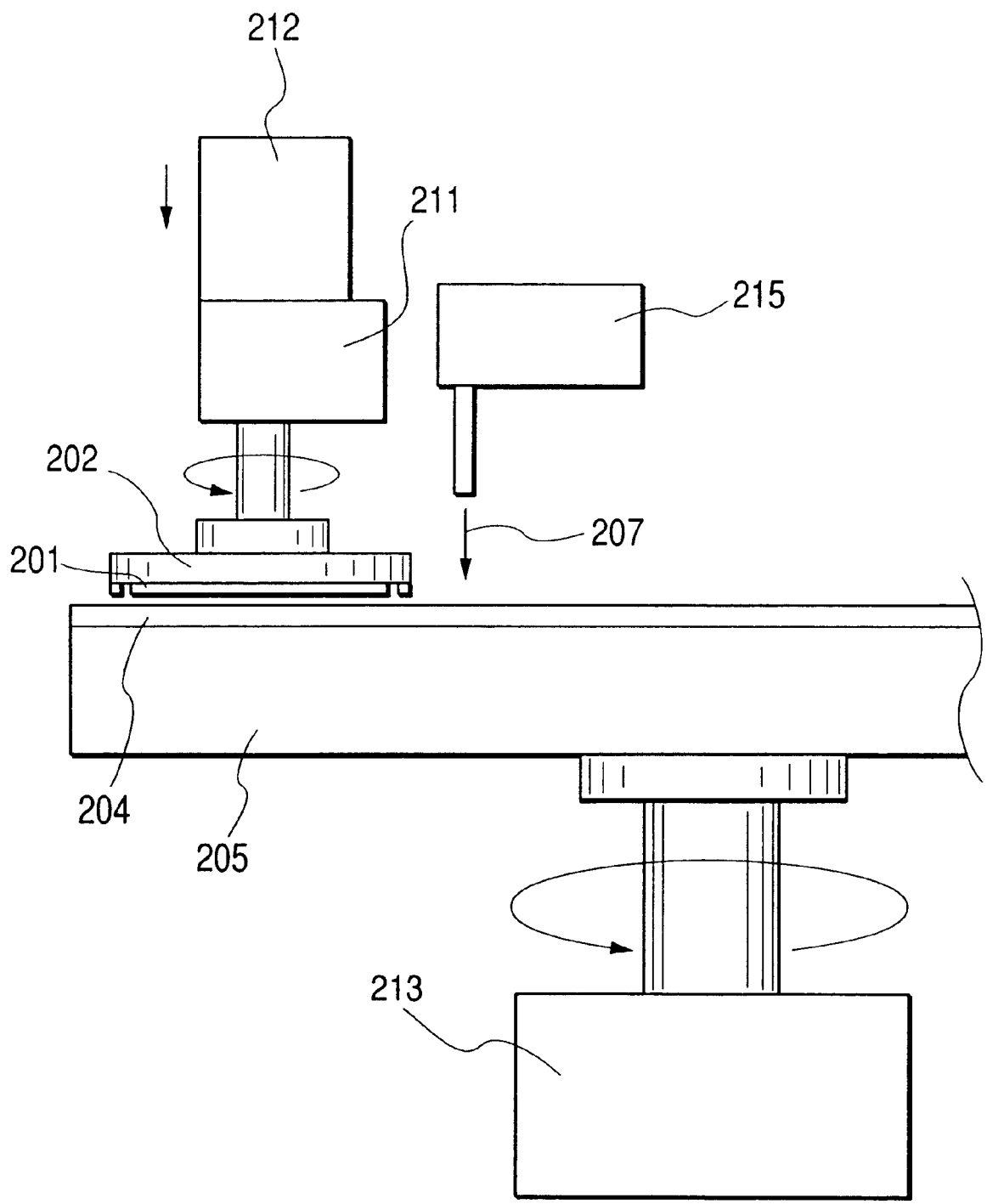
FIG. 7 is a schematic illustration of a known chemical mechanical polishing (CMP) apparatus.

In a dual damascene process, as shown in FIGS. 6A to 6D, wiring grooves 103 and grooves for contact holes 104 (see FIG. 6B) are formed in the insulating film 102 (see FIG. 6A) that is formed on a substrate 101 where various devices are formed in advance and flattened by CMP. Note that the wiring groove 103 and the grooves for contact holes 104 are formed by forming respective resist patterns having respective profiles on the insulating film 102 by means of photolithography and then etching the insulating film 102 typically by means of an RIE technique, using the resist patterns. Thereafter, the wiring metal of copper (Cu), aluminum (Al), tungsten (W) or a metal compound containing any of these metals as principal ingredient is buried into the wiring grooves 103 and the grooves for contact holes 104 by means of a film forming technique such as CVD or sputtering (see FIG. 6C). Before forming the film of the wiring metal 105, a barrier film typically made of titanium nitride (TiN) may be formed on the surface of the insulating film 102 and the inner surfaces of the wiring grooves 103 and the grooves for contact holes 104. Thereafter, as shown in FIG. 6D, the wiring metal film 105 is polished by a precision polishing method according to the invention until the underlying insulating film 102 is exposed to remove the wiring metal film 105 except the film in the wiring grooves 103 for contact holes 104 to complete the process of forming the metal wires 106 and the contact wires 107 that are buried in the grooves 103 and 104.

As discussed above, when polishing the surface of a substrate 101, wiring grooves 103 and grooves for contact holes 104 have been formed in the insulating film 102 formed as flattened on the surface to be polished of the substrate 101 and a layer of the wiring metal 105 that is mostly copper has been formed on the insulating film 102 to bury the grooves (see FIG. 6C). Then, also as discussed above, an etching solution obtained by mixing iron (III) chloride with pure water, regulating the specific gravity of the mixture to about 1.38 and adding 1 to 5% hydrochloric acid thereto is preferably used to flatten and remove the wiring metal film 105. If a different wiring material is used, a different etching solution (chemical solution) that matches the properties of the wiring material will be selected.

In the process of flattening and removing the wiring metal film formed on a substrate, frictional heat will be generated by the friction between the hard polishing pad 4 and the surface of the wiring metal film on the substrate 1, particularly in the projecting areas of the metal film, as the surface of the wiring metal film that is the surface to be polished of the substrate 1 is pressed against the hard polishing pad 4 and they are driven to revolve relative to each other. Particularly, in the case of a dual damascene process where the insulating film underlying the wiring metal film shows a very low thermal conductivity relative to that of the wiring metal, or copper, the frictional heat generated locally on the surface of the metal film in areas held in tight contact with the pad 4 (projecting areas of the metal film) is stored in the wiring metal layer typically made of copper. As a result, even if the pressure applied to the substrate 1 is remarkably lower than the pressure used in comparable conventional processes, the temperature at and near the surface will be highest in the areas held in tight contact with the polishing pad 4 and falls in areas remote from those areas that are held in tight contact. With this arrangement of raising the temperature in the projecting areas of the surface of the wiring metal film on the substrate by means of frictional heat, the etching solution will produce an enhanced etching rate in the heated areas (projecting areas) to promote the etching effect in those areas by far more than the remaining area so that those areas are selectively etched to flatten the entire surface of the wiring metal film. Additionally, in a dual damascene process where the insulating film underlying the wiring metal film is already flattened, the projecting areas are not very steep and all the surface of the wiring metal film is relatively flat so that it is relatively easy to etch and polish the slightly projecting areas of the wiring metal film at a high etching rate in order to flatten the entire surface of the wiring metal film.

As described above, with this arrangement of etching and polishing the projecting areas of the wiring metal film at a high etching rate, the entire surface of the wiring metal film can be flattened. Thereafter, the wiring metal film is etched and removed uniformly by the etching solution until the underlying insulating film comes to be exposed. The operation of flattening and removing the wiring metal film is completed when the wiring metal film no longer shows any residue thereof on the surface of the substrate 1. Since the etching solution does not affect the insulating film, no overpolishing problem occurs and hence, advantageously, the use of an independent stopper is not necessary for the purpose of the invention.

In the case of a dual damascene process where the insulating film underlying the wiring metal film is reliably flattened, the undulations, if any, of the surface of the wiring metal film are not very remarkable and hence, by supplying the etching solution under control in such a way that the heat in the non-contact area can be discharged satisfactorily, the surface can be reliably flattened only if the temperature dependency of the etching effect is varied by more than 5%.

Additionally, for the purpose of the invention, the pressure required to generate frictional heat to a necessary level will be such that it produces a temperature rise only between several to less than twenty ° C. for realizing the thermal selectivity if the polishing pad is made of a relatively hard material such as polytetrafluoroethylene. Thus, the pressure required for pressing the substrate against the polishing pad in a precision polishing apparatus according to the invention will be far lower than the pressure required for comparable polishing methods.

While the temperature of the projecting areas of the surface (of the metal film) to be polished is raised by the frictional heat mostly generated by the friction between the projecting areas and the polishing pad to selectively etch the projecting areas and flattens the surface to be polished in the above description, the present invention is not limited to the use of such frictional heat and it is also possible for the purpose of the invention to use a heat control means such as a heating means or a cooling means to selectively etch the projecting areas by controlling the temperature difference between the areas to be etched at a high etching rate and the remaining area of the surface. More specifically, the etching rate of the etching solution is raised in the projecting areas of the surface to be polished (of the metal film) to selectively etch them by using a heat control means such as a heating means or a cooling means and raising the temperature of the etching solution in the projecting areas of the surface to be polished (of the metal film) to a level higher than temperature level of the remaining area of the surface or lowering the temperature of the etching solution in the area other than the projecting areas than that of the projecting areas, whichever appropriate.

For the purpose of the present invention, any of the ten types of etching solutions as listed below may alternatively be used in place of the above described etching solution.

(1) A solution of a mixture of ultra-pure water, hydrogen peroxide and ammonia, to which potassium hydroxide may or may not be added.

(2) A solution mainly containing ultra-pure water, hydrochloric acid and iron chloride, to which ethanol may or may not be added.

(3) A solution obtained by adding hydrochloric acid and nitric acid to ultra-pure water.

(4) A solution containing ultra-pure water, nitric acid and phosphoric acid, to which hydrochloric acid may or may not be added.

(5) A solution mainly containing ultra-pure water and nitric acid, to which silver nitrate or chromium oxide may or may not be added.

(6) A solution mainly containing ultra-pure water and phosphoric acid, to which methanol, ammonium acetate or ethylene glycol may or may not added.

(7) A solution mainly containing ultra-pure water and sulfuric acid, to which phosphoric acid, potassium hydroxide or sodium hydroxide may or may not be added.

(8) A solution mainly containing ultra-pure water and nitric acid, to which hydrofluoric acid or glacial acetic acid may or may not be added.

(9) A solution mainly containing ultra-pure water and hydrogen peroxide, to which potassium hydroxide, hydrofluoric acid or methanol may or may not be added.

(10) A solution containing ultra-pure water and hydrochloric acid, to which nitric acid, hydrofluoric acid of both may or may not be added.

If the required level of purity is satisfied, ultra-pure water may be replaced by ordinary clean water in any of the above solutions.

For the purpose of the invention, hydrochloric acid in any of the related ones of the above solutions refers to hydrogen chloride.

A surface active agent and/or an etching promoting agent or an etching suppressing agent may be added to any of the above listed solutions.

Preferably, the etching solution has a specific gravity between 0.79 and 2.1 for realizing an improved etching effect for the purpose of the invention.

The etching solution may contain microparticles in order to improve the etching effect. Then, the etching solution can provide a physical polishing effect through the use of microparticles contained in it as abrasive grains in addition to the chemical etching effect of the etching solution on the surface to be polished of the metal film.

Such microparticles preferably have a spherical profile.

The primary particle diameter of the microparticles contained in the etching solution is preferably between 0.02 and 0.5 $\mu$m. Then, a high polishing rate will be achieved without significantly damaging the surface to be polished.

If the etching solution contains microparticles, its specific gravity preferably shows a value greater than the value it shows when the etching solution does not contain microparticles.

The microparticles contained in the etching solution are preferably not soluble or hardly soluble in the etching solution.

Second Embodiment

FIG. 2 is a schematic illustration of the second embodiment of precision polishing apparatus according to the invention, showing its configuration. This embodiment of precision polishing apparatus comprises a cooling means for cooling the substrate 1 as heat control means 10, which cooling means (heat control means) 10 controls the temperature of the area of the metal film other than the projecting areas to a level lower than the temperature level of the projecting areas so as to consequently keep the temperature of the projecting areas higher than that of the remaining area during the polishing process. Otherwise, this second embodiment is identical with the above described first embodiment.

In a dual damascene process, wiring metal that is normally copper is buried in the wiring grooves and the grooves for contact holes formed in the insulating film to such an extent that it partly passes through the insulating film layer and gets to the device forming layer and the underlying lower wiring layer. Then, the temperature of the area other than the areas projecting high from the wiring metal layer having a high thermal conductivity is held lower than that of the projecting areas by controlling the rear surface of the substrate by the cooling means arranged for this purpose. As a result, the etching rate of the projecting areas can be raised from that of the remaining area for the purpose of selective etching.

As described above, the surface of a substrate is polished mainly by relying on the chemical effect of the etching solution when the temperature of the projecting areas of the wiring metal layer on the surface to be polished is controlled or the frictional heat generated by the friction between the hard polishing pad is utilized. Additionally, in a dual damascene process where the insulating film underlying the wiring metal film is already flattened, the projecting areas are not very steep nor high and all the surface of the wiring metal film is relatively flat so that the pressure required for pressing the substrate against the polishing pad in order to generate frictional heat can be reduced by using a relatively hard polishing pad if compared with conventional polishing techniques. Still additionally, by supplying the etching solution under control in such a way that the heat in the non-contact area can be discharged satisfactorily, the surface of the wiring metal layer can be held free from the problem of a dishing phenomenon. Still additionally, since no polishing agent that contains abrasive grains is used, there arises no risk of producing scratches on the metal surface nor that of partly burying the abrasive grains of the polishing agent into the wiring material. Furthermore, since the operation mainly relies on the chemical effect and the operating pressure applied to the substrate can be reduced unlike conventional CMP techniques, no process-altered layer would appear on and near the metal surface as a result of the polishing operation. Therefore, buried wires can be reliably formed in the wiring grooves and the grooves for contact holes formed in the insulaing film on a semiconductor device.

Finally, a polishing agent of fine solid particles or fine abrasive particles with a primary particle diameter between 0.02 and 0.5 $\mu$m or a stabilizer agent may be added to the etching solution in order to promote or suppress, whichever appropriate, the heat generation caused by friction. Even if such fine solid particles or fine abrasive particles are added, the pressure required for pressing the substrate against the polishing pad in order to generate frictional heat can be reduced if compared with conventional polishing techniques.

Thrid Embodiment

Now, the third embodiment of precision polishing apparatus according to the invention will be described by referring to FIG. 3.

The third embodiment of precision polishing apparatus is also characterized in that a polishing pad having a size greater than the substrate that may be a wafer can be used for polishing the substrate. More specifically, the third embodiment of precision polishing apparatus comprises a substrate table 23 provided with a substrate-holding part 22, which may be a wafer chuck, for holding a substrate 21, which may be a wafer, with the surface to be polished facing upward, a polishing head 25 arranged vis-a-vis the substrate 21 held by the substrate holding part 22 and carrying a large caliber hard polishing pad 24 having a diameter greater than that of the substrate 21 as the latter is bonded thereto, a first drive means 31 for driving the substrate table 23 to revolve, a reciprocating means 32 for driving both the substrate table 23 and the substrate 21 to reciprocate, a second drive means 33 for driving the polishing head 25 to revolve, and a polishing pad vertically driving means/pressurizing means 34 for driving the polishing head 25 and the hard polishing pad 24 to move vertically and pressing the hard polishing pad 24 against the surface to be polished of the substrate 21 under pressure of a predetermined level, said first drive means 31 and said second drive means 33 being arranged to drive the substrate 21 and the hard polishing pad 24 to revolve substantially at a same rate. Additionally, there is provided a polishing agent supply means 35 for feeding a polishing agent 27 to a solution supply system 36 running through the center of the polishing head 25 and the hard polishing pad 24 and then further to between the substrate 21 and the hard polishing pad 24.

With the embodiment of precision polishing apparatus having the above described configuration, the substrate 21 to be polished is fitted to the substrate holding part 22 of the substrate table 23 with the surface to be polished facing upward and moved to a position directly below the polishing head 25 that carries the hard polishing pad 24 bonded to the lower surface thereof as shown in FIG. 3. Then, the etching solution 27 is fed from the etching solution supply means 35 to the surface of the substrate 21 by way of the solution supply system 36 and the center of the hard polishing pad 24. At the same time, the substrate 21 and the hard polishing pad 24 are driven to revolve respectively by the first drive means 31 and the second drive means 33 in the directions as indicated by arrows in FIG. 3. Additionally, the hard polishing pad 24 is made to abut the surface to be polished of the substrate 21 and pressed against the latter under pressure of a predetermined level by the polishing pad vertically driving means/pressurizing means 34. At this time, it is possible to cause the substrate 21 to make a reciprocating motion by the reciprocating means 32 to an extent that does not affect the respective revolutions per unit time of the hard polishing pad 24 and the substrate 21. It is also possible to cause the hard polishing pad 24 to make a reciprocating motion by a reciprocating means (not shown).

In this way, the etching solution 27 is supplied to between the surface to be polished of the substrate 21 and the hard polishing pad 24 while they are moved relative to each other as in the case of the above described first embodiment. Thus, the projecting areas of the surface to be polished is selectively etched due to the temperature difference in the etching solution 27 to flatten the metal film, which is then removed by the uniform etching effect as in the case of the first embodiment.

The etching solution is supplied to between the surface to be polished of the substrate and the polishing pad and used for the operation of etching the surface. However, what is remarkable about this embodiment is that the used etching solution is collected, filtered and then regulated for the contents of the ingredients so that it can be recirculated for reuse. With this arrangement of recirculating used etching solution, the running cost of the embodiment can be greatly reduced.

In the case of a dual damascene process where a barrier film typically made of TiN is used in order to prevent diffusion of copper ions, an etching solution adapted to etch TiN may have to be used after the ordinary etching solution.

Figure 4:
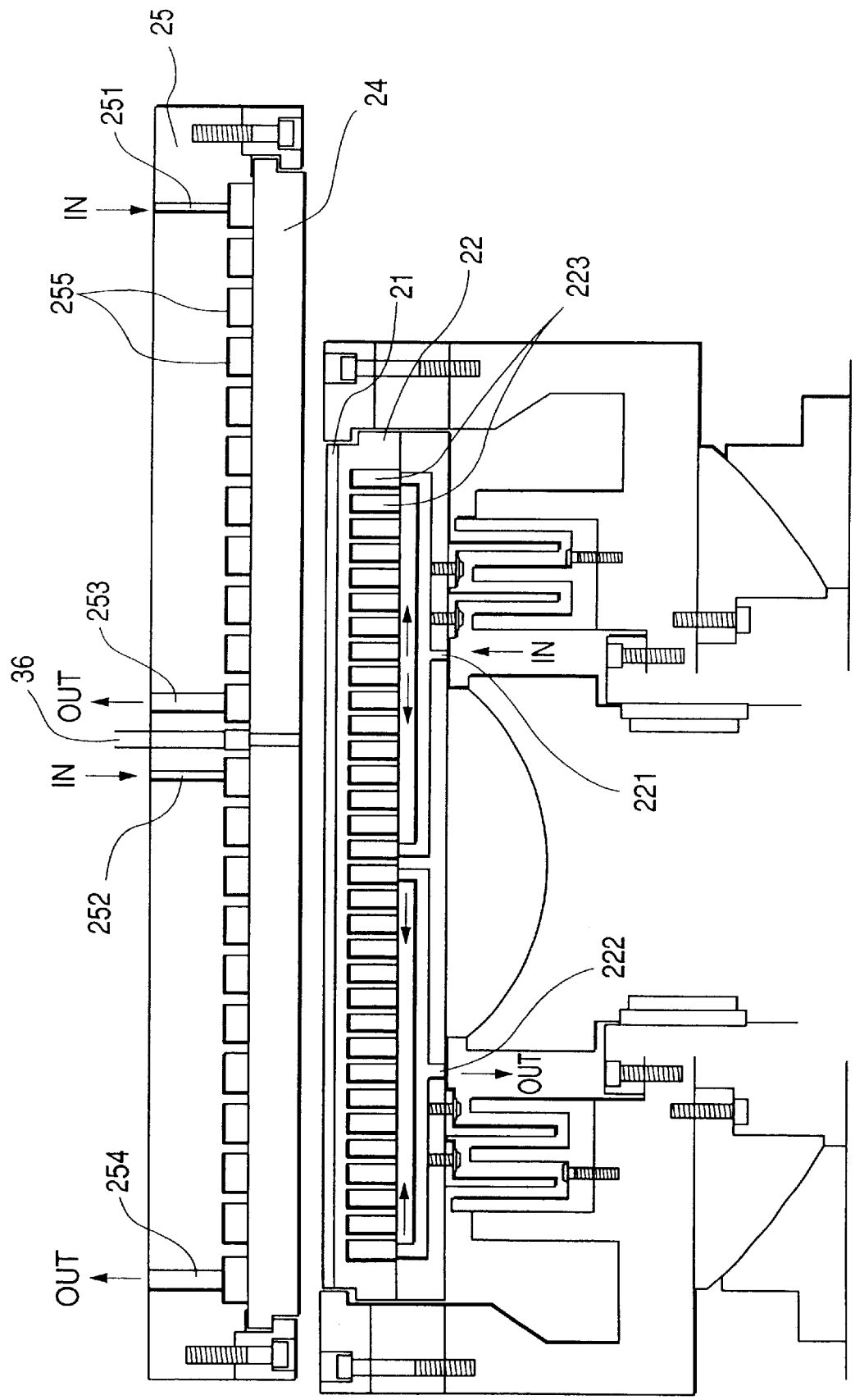
FIG. 4 is a schematic illustration of the polishing head and the means for holding the object to be polished of the third embodiment.

FIG. 4 is a schematic illustration of the polishing head 25 and the means for holding the object to be polished 22 of the third embodiment shown in FIG. 3.

Referring to FIG. 4, both the polishing head 25 and the means for holding the object to be polished 22 of this embodiment of precision polishing apparatus are provided with respective fluid flow paths 255 as heat control means. The fluid flow paths are tubes and the fluid is water in this embodiment, although the fluid may be gas or liquid. The polishing head 25 is provided with a pair of fluid paths 255 that are arranged at the surface for holding the hard polishing pad 24. It is also provided with a pair of inlet holes 251 and 252 for introducing fluid into the respective fluid flow paths 255 and a pair of outlet holes 253 and 254 for delivering fluid to the outside from the respective fluid flow paths 255.

The means for holding the object to be polished 22 is also provided with a pair of fluid flow paths 223, which have an inlet hole 221 for introducing fluid into them and an outlet hole 222 for delivering fluid to the outside from the fluid flow paths 223. Note that a single inlet hole 221 is provided to introduce fluid into two fluid paths and a single outlet hole 222 is provided to deliver fluid to the outside from the two fluid path for the purpose of simplifying the configuration of the apparatus.

Thus, the temperature of the surface to be polished can be controlled during the polishing, or etching, operation by means of the fluid flow paths 255 arranged in the polishing head 25 that carries a hard polishing pad.

The temperature of the surface to be polished can also be controlled during the polishing, or etching, operation by means of the fluid flow paths 223 arranged in the means for holding the object to be polished 22. Particularly, when the substrate 21 carries a metal film formed on an insulating layer and the metal film fills the grooves of the insulating layer, the projecting areas of the metal film, particularly those on the grooves, can be selectively heated or cooled to selectively polish the metal film in those areas by utilizing the high thermal conductivity of metal.

Figure 5:
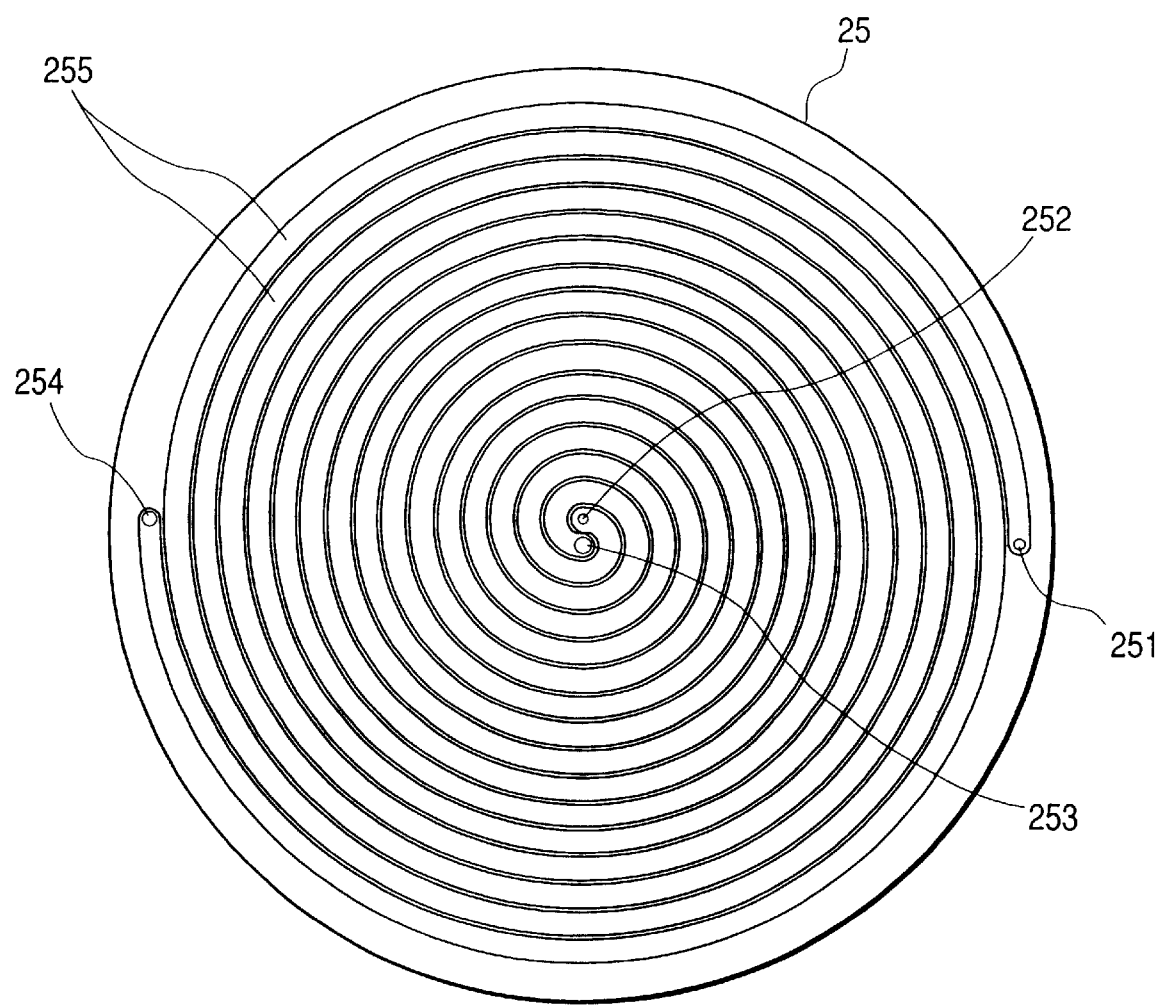
FIG. 5 is a schematic illustration of the polishing head of the third embodiment as viewed from the side of holding the polishing pad.

FIG. 5 is a schematic illustration of the polishing head 25 of FIG. 4 as viewed from the side of holding the polishing pad. In FIG. 5, the components same as those of FIG. 4 are denoted respectively by the same reference symbols. As shown in FIGS. 4 and 5, the fluid flow paths 255 arranged in the polishing head 25 are of a spiral type. A pair of fluid flow paths 255 are arranged in the polishing head 25. One of the fluid flow path 255 is spirally arranged along the other fluid flow path 255. With this arrangement, the polishing head 25 is provided with a pair of spiral fluid flow paths 255 that are wound in the same sense. Note that the means for holding the object to be polished 22 is also provided with a pair of spiral fluid flow paths 223 that are similar to the fluid flow paths 255 of the polishing head 25.

Referring to FIG. 5, one of the fluid flow paths 255 is provided with the inlet hole 251 and the outlet hole 253, while the other fluid flow path 255 is provided with the inlet hole 252 and the outlet hole 254. The inlet hole 251 is disposed at the periphary of the polishing head 25 and hence at a position remote from the axis of rotation of the latter. On the other hand, the outlet hole 253 is located at the center of the polishing head 25 and hence at the axis of rotation of the latter. The other inlet hole 252 is arranged at the center of the polishing head 25 and hence at the axis of rotation of the latter. On the other hand, the outlet hole 254 is located at the periphery of the polishing head 25 and hence at a position remote from the axis of rotation of the latter.

With this arrangement of juxtaposing a pair of fluid flow paths, one of which leads fluid from the axis of rotation to the periphery remote from the axis while the other leads fluid from the periphery remote from the axis of rotation to the axis, the temperature difference that may arise in each of the fluid flow paths can be offset by that of the other. As a result, the temperature difference on the surface to be polished that may arise between a peripheral area and an axial area thereof can be minimized to produce a uniform temperature distribution over the entire surface to be polished. Then, the projecting areas of the surface to be polished showing a uniform temperature distribution give rise to a temperature rise due to the friction between them and the polishing pad to consequently produce a high etching rate there so that the metal film is accurately flattened. The projecting areas are those that are abraded by the polishing pad and may include both large projections produced when the substrate is warped and micro projections of the sizes of semiconductor devices to be formed on the substrate as described earlier by referring to FIG. 6C.

The temperature of the surface to be polished can be controlled to show a uniform temperature distribution simply by using spiral fluid flow paths that are by no means costly. If water is used as fluid, the running cost will be further reduced.

The inlet holes of both of the two fluid flow paths 255 of the polishing head 25 may be arranged at the periphery of the polishing head 25 and the outlet holes of the two fluid flow paths 255 may be arranged at the axis of rotation of the polishing head 25. Alternatively, the inlet holes of both of the two fluid flow paths 255 may be arranged at the axis of rotation of the polishing head 25 and the outlet holes of the two fluid flow paths 255 may be arranged at the periphery of the polishing head.

While the polishing head 25 is provided with a pair of fluid flow paths 255 in this embodiment, it may alternatively be provided with a single fluid flow path 255 for the purpose of the invention.

While both the polishing head 25 and the means for holding the object to be polished 22 are provided with respective fluid flow paths in this embodiment, only either of them may be provided with one or more than one fluid flow paths for the purpose of the invention.

As described above in detail, with a chemical mechanical polishing (CMP) method mainly relying on the chemical effect of the polishing agent, or the etching solution, according to the invention, the wiring metal film produced by a dual damascene process can be flattened and then removed by means of selective etching utilizing an etching rate that varies as a function of the temperature of the etching solution. Additionally, the pressure applied to the surface to be polished and the polishing pad may be sufficient if it generates heat by friction so that it may be far lower than the pressure required for comparable conventional polishing methods. The pressure can be further reduced by using a relatively hard polishing pad. As a result, the surface to be polished is made free from the problem of a dishing phenomenon. Still additionally, since no polishing agent that contains abrasive grains is used, there arises no risk of producing scratches on the metal surface nor that of partly burying the abrasive grains of the polishing agent into the wiring material.

Furthermore, since the operating pressure applied to the substrate can be reduced unlike conventional CMP techniques, no process-altered layer would appear on and near the metal surface as a result of the polishing operation, whereby ideal flattening and removal of metal films can be realized.

A polishing agent of fine solid particles or fine abrasive particles may be added to the etching solution in order to promote or suppress, whichever appropriate, the heat generation caused by friction. Even if such fine solid particles or fine abrasive particles are added, the pressure required for pressing the substrate against the polishing pad can be reduced further so that there arises no risk of producing scratches on the metal surface nor that of partly burying the abrasive grains of the polishing agent into the wiring material.

Additionally, since the etching solution does not affect the insulating film, no overpolishing problem occurs and hence, advantageously, the use of an independent stopper is not necessary for the purpose of the invention.

Thus, according to the invention, buried wires can be reliably formed in the wiring grooves and the grooves for contact holes formed in the insulating film on a semiconductor device in a dual damascene process.

Finally, according to the invention, the substrate is polished by a precision polishing apparatus where at least either the polishing head or the means for holding the substrate is provided with one or more than one spiral type fluid flow path as temperature control means. Then, the entire surface to be polished of the substrate is made to show a uniform temperature distribution as fluid is made to flow through the fluid flow paths. Then, the projecting areas of the surface to be polished showing a uniform temperature distribution give rise to a temperature rise to consequently produce a high etching rate there so that the metal film is accurately flattened.

What is claimed is:

1. An apparatus for polishing a substrate, said substrate comprising a surface to be polished, which said surface comprises a metal at least in part and has projecting areas, said apparatus comprising:
   a polishing pad,
   a substrate holder for holding the substrate by making the surface to be polished of said substrate abut said polishing pad,
   a first drive means for driving said substrate holder to revolve,
   a second drive means for driving said polishing pad to revolve,
   a supply means for supplying to the surface to be polished of said substrate an etching solution for etching said metal,
   a temperature control means for controlling a temperature of the substrate arranged in said substrate holder, and
   a temperature uniforming means arranged in said substrate holder for making the temperature of the substrate uniform comprising a first and second spiral fluid flow paths arranged from the center of rotation of said substrate holder toward the periphery thereof in the form of a double spiral, said first spiral fluid flow path being provided with a first inlet hole disposed at the center from which a fluid is introduced and a first outlet hole disposed at the periphery from which the fluid is removed, said second spiral fluid flow path being provided with a second inlet hole disposed at the periphery from which the fluid is introduced and a second outlet hole disposed at the center from which the fluid is removed,
   wherein said temperature control means for controlling the temperature of said substrate to make the temperature of the projecting areas higher than the temperature of areas other than said projecting areas, thereby making an etching rate of the projecting areas higher than an etching rate of the areas other than said projecting areas.

2. The polishing apparatus according to claim 1, wherein said temperature control means comprises a cooling means for cooling said substrate.

3. The polishing apparatus according to claim 1, wherein said temperature control means comprises said temperature uniforming means, a fluid introducing means for introducing a fluid of liquid or gas into the first inlet hole or the second inlet hole, and a fluid delivering means for removing said fluid from the first outlet hole or the second outlet hole.

4. The polishing apparatus according to claim 1, further comprising a polishing head for holding said polishing pad and an additional temperature control means arranged in said polishing head for controlling the temperature of said polishing pad.

5. The polishing apparatus according to claim 4, wherein said additional temperature control means comprises a fluid flow path arranged in said polishing head, a fluid introducing means for introducing a fluid of liquid or gas from one end of said fluid flow path, and a fluid delivering means for delivering said fluid from the other end of said fluid flow path.

6. The polishing apparatus according to claim 5, wherein said fluid flow path comprises a first and second spiral fluid flow paths arranged from the center of rotation of said polishing head toward the periphery thereof in the form of a double spiral, said first spiral fluid flow path being provided with a first inlet hole disposed at the center from which a fluid is introduced and a first outlet hole disposed at the periphery from which the fluid is delivered, said second spiral fluid flow path being provided with a second inlet hole disposed at the periphery from which the fluid is introduced and a second outlet hole disposed at the center from which the fluid is delivered.

7. The polishing apparatus according to claim 1, further comprising a pressuring means for pressing the surface to be polished of said substrate against said polishing pad.

8. The polishing apparatus according to claim 1, further comprising a temperature control means for controlling the temperature of said etching solution.

9. The polishing apparatus according to claim 1, further comprising a collecting means for collecting said etching solution supplied to the surface to be polished, a filtering and regulating means for filtering the collected etching solution and regulating the ingredients thereof, and a circulating means for circulating the etching solution to which the filtering and the regulation of the ingredients have been performed.

10. The polishing apparatus according to claim 1, wherein said metal is selected from the group consisting of copper, aluminum, tungsten and an alloy containing at least one of these metals.

11. The polishing apparatus according to claim 1, wherein said etching solution is selected from the group consisting of a solution containing iron (III) chloride or copper (II) chloride, an alkaline aqueous solution containing a copper amine complex as the principal ingredient, and an etching solution containing a mixture of hydrogen peroxide and a nitric acid type solution.

12. The polishing apparatus according to claim 1, wherein said polishing pad has a modulus of compressive elasticity between $9.8 \times 10^7$ Pa and $9.8 \times 101^{10}$ Pa.

* * * * *

UNITED STATES PATENT AND TRADEMARK OFFICE
CERTIFICATE OF CORRECTION

PATENT NO. : 6,358,360 B1
DATED : March 19, 2002
INVENTOR(S) : Kazuo Takahashi

It is certified that error appears in the above-identified patent and that said Letters Patent is hereby corrected as shown below:

Column 3,
Line 7, "polising" should read -- polished --.

Column 4,
Line 3, "polishing" should read -- polished --.

Column 5,
Line 30, "is" should read -- are --.

Column 6,
Line 45, "otained" should read -- obtained --.

Column 10,
Line 8, "of" should read -- or --.

Column 11,
Line 41, "Thrid" should read -- Third --.

Column 12,
Line 36, "is should read -- are --.

Column 14,
Line 27, "either" should read -- one --.

Signed and Sealed this

Eighteenth Day of June, 2002

Attest:

JAMES E. ROGAN
Attesting Officer
Director of the United States Patent and Trademark Office